(12) United States Patent
Yagishita (10) Patent No.: US 7,608,890 B2
(45) Date of Patent: Oct. 27, 2009

(54) SEMICONDUCTOR DEVICE AND METHOD OF MANUFACTURING SEMICONDUCTOR DEVICE

(75) Inventor: Atsushi Yagishita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 391 days.

(21) Appl. No.: 11/451,318

(22) Filed: Jun. 13, 2006

(65) Prior Publication Data

US 2007/0004117 A1    Jan. 4, 2007

(30) Foreign Application Priority Data

Jun. 14, 2005   (JP) ............................. 2005-173606

(51) Int. Cl.
*H01L 27/108* (2006.01)
(52) U.S. Cl. ................ 257/347; 257/329; 257/E27.112
(58) Field of Classification Search ................ 257/329, 257/347, 401, E29.262, E29.294, E27.112
See application file for complete search history.

(56) References Cited

U.S. PATENT DOCUMENTS 6,063,688 A    5/2000   Doyle et al.
6,924,178 B2 *  8/2005  Beintner .................... 438/157
7,087,471 B2 *  8/2006  Beintner .................... 438/164
7,224,019 B2 *  5/2007  Hieda et al. ................ 257/315

OTHER PUBLICATIONS

Choi, Y. K. et al., "A Spacer Patterning Technology for Nanoscale CMOS," IEEE Transactions on Electron Devices, vol. 49, No. 3, pp. 436-441, (Mar. 2002).

* cited by examiner

*Primary Examiner*—Roy K Potter
(74) *Attorney, Agent, or Firm*—Finnegan, Henderson, Farabow, Garrett & Dunner, L.L.P.

(57) ABSTRACT

A method of manufacturing a semiconductor device includes forming a plurality of Fins including a semiconductor material on an insulation layer; forming gate insulation films on sidewalls of the Fins; forming a gate electrode which extends in a direction of arrangement of the Fins and which is electrically insulated from the Fins, the gate electrode is common in the Fins on the gate insulation film; implanting an impurity into portions of the Fins by using the gate electrode as a mask to form a source-drain diffusion layer, the portions of the Fins extending on both sides of the gate electrodes; and depositing a conductive material on both sides of the Fins to connect the Fins to each other.

10 Claims, 12 Drawing Sheets

FIG. 14B
pMOS

FIG. 14A
nMOS

FIG. 15A nMOS

FIG. 15B pMOS

SEMICONDUCTOR DEVICE AND METHOD OF MANUFACTURING SEMICONDUCTOR DEVICE

CROSS-REFERENCE TO RELATED APPLICATION

This application is based upon and claims the benefit of priority from the prior Japanese Patent Applications No. 2005-173606, filed on Jun. 14, 2005, the entire contents of which are incorporated herein by reference.

BACKGROUND OF THE INVENTION

1. Field of the Invention

The present invention relates to a semiconductor device and a method of manufacturing a semiconductor device.

2. Related Art

As a method of forming a Fin portion of a Fin transistor, a spacer-lithography technique is proposed. As the spacer-lithography technique, a Sidewall pattern Transfer (SWT) technique is known.

The SWT is a method which can form Fin portions at a pitch smaller than the minimum pitch of lithography. Conventional SWT is executed by the following method. A silicon nitride film is deposited on an SOI (Silicon On Insulator). Furthermore, in a region for forming a Fin, a hard mask such as a TEOS film on poly-Si film is formed on the silicon nitride film. In a region (for example, a pad region of a source-drain electrode for connecting adjacent Fins to each other) except for the Fin region, a photoresist mask is formed on the silicon nitride film. By using the hard mask and the photoresist mask as masks, the silicon nitride films are simultaneously etched by RIE (Reactive Ion Etching). The patterned silicon nitride film is used as a mask when an SOI film under the silicon nitride film is etched. The etched SOI layer is used as a Fin.

In this manner, in the conventional SWT, the silicon nitride film is etched by using both of the hard mask and the photoresist mask as masks. When the silicon nitride film is etched with high anisotropy of RIE, the photoresist mask is etched at a speed higher than the etching speed of the hard mask. More specifically, in this case, selectivity between both the hard mask and the photoresist mask and the silicon nitride film cannot be easily assured.

On the other hand, when etching is performed with low anisotropy of RIE, a sidewall shape of a silicon nitride film etched by using the hard mask may be tapered. More specifically, the verticality of the side wall of the patterned silicon nitride film is deteriorated. In this manner, the width of a Fin formed by using the silicon nitride film as a mask becomes ununiform, or the width becomes larger than a desired width disadvantageously.

Therefore, when both the hard mask and the photoresist mask are used as masks, Fins having a pitch smaller than the minimum pitch of lithography and each having a uniform width cannot be easily formed.

SUMMARY OF THE INVENTION

A method of manufacturing a semiconductor device according to an embodiment of the invention comprises forming a plurality of Fins including a semiconductor material on an insulation layer; forming gate insulation films on sidewalls of the Fins; forming a gate electrode which extends in a direction of arrangement of the Fins and which is electrically insulated from the Fins, the gate electrode is common in the Fins on the gate insulation film; implanting an impurity into portions of the Fins by using the gate electrode as a mask to form a source-drain diffusion layer, the portions of the Fins extending on both sides of the gate electrodes; and depositing a conductive material on both sides of the Fins to connect the Fins to each other.

A semiconductor device according to an embodiment of the invention comprises an insulation layer; a plurality of Fins arranged on the insulating film at a pitch smaller than a minimum pitch which can be achieved by lithography; gate insulation films formed on sidewalls of the Fins; a gate electrode which extends in a direction of arrangement of the Fins and which is electrically insulated from the plurality of Fins, the gate electrode being common in the plurality of Fins; source-drain layers formed in portions of the Fins, the portions of the Fins being arranged on both sides of the gate electrode; and a metal or a metal silicide which is in contact with upper surfaces or side surfaces of the source-drain layers of the plurality of Fins to connect the Fins to each other.

DETAILED DESCRIPTION OF THE INVENTION

Embodiments of the present invention will be described below with reference to the accompanying drawings. The embodiments do not limit the present invention.

First Embodiment

Figure 1:
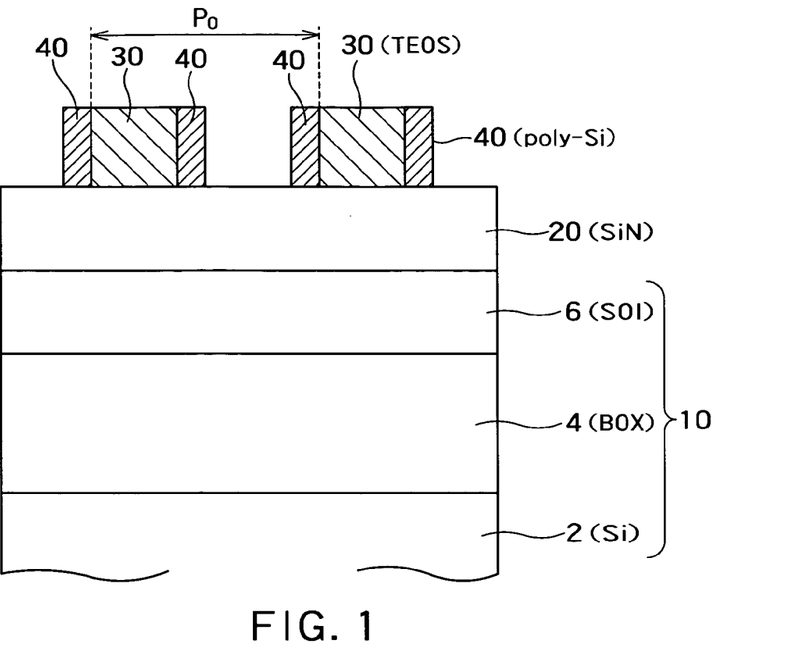
FIGS. 1 to 7 are diagram showing a method of manufacturing a Fin FET according to the first embodiment of the present invention.
Figure 2:
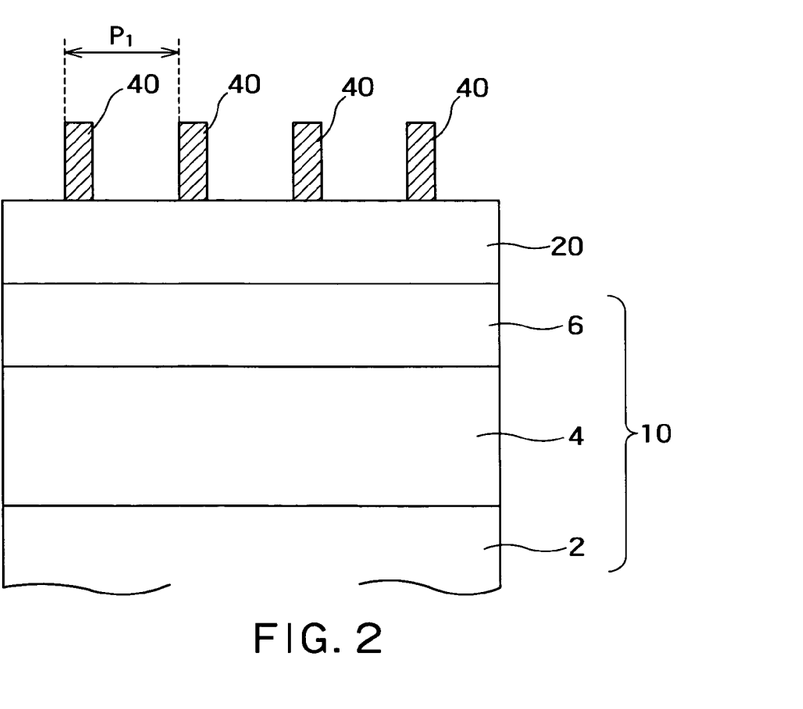

FIGS. 1 to 7 are diagram showing a method of manufacturing a Fin FET according to the first embodiment of the present invention. FIGS. 1 and 2 are sectional views, and FIGS. 3 to 7 are perspective views.

As shown in FIG. 1, an SOI substrate 10 including a silicon substrate 2, a BOX (Buried Oxide) layer 4, and an SOI layer 6 is prepared. The thickness of the SOI layer 6 is about 50 nm. A silicon nitride film 20 is deposited on the SOI layer 6 as a material for a hard mask. The width of the silicon nitride film 20 is about 70 nm.

A TEOS (tetraethoxysilane) film for a dummy pattern is deposited on the silicon nitride film 20. The thickness of the TEOS film is about 100 nm. The TEOS film is patterned by a lithography technique to form a dummy pattern 30. A plurality of dummy patterns 30 are formed to be arranged at a minimum pitch $P_0$ which can be achieved by lithography. In FIG. 1, two dummy patterns 30 are shown. However, patterning may be performed to arrange three or more dummy patterns 30. In this case, the pitch means a sum of a wire width and an inter-wire width, i.e., a width of a line and space.

Amorphous silicon is deposited as a sidewall material on the dummy pattern 30 by using CVD (Chemical Vapor Deposition). The thickness of the amorphous silicon is about 20 nm. The amorphous silicon is anisotropically etched to leave sidewall patterns 40 on both side surfaces of the dummy pattern 30.

Subsequently, as shown in FIG. 2, the dummy pattern 30 is selectively etched by wet etching while leaving the sidewall patterns 40. In this manner, the plurality of sidewall patterns 40 are formed to be arranged at a pitch $P_1$ almost half the minimum pitch $P_0$ which can be achieved by lithography.

Figure 3:
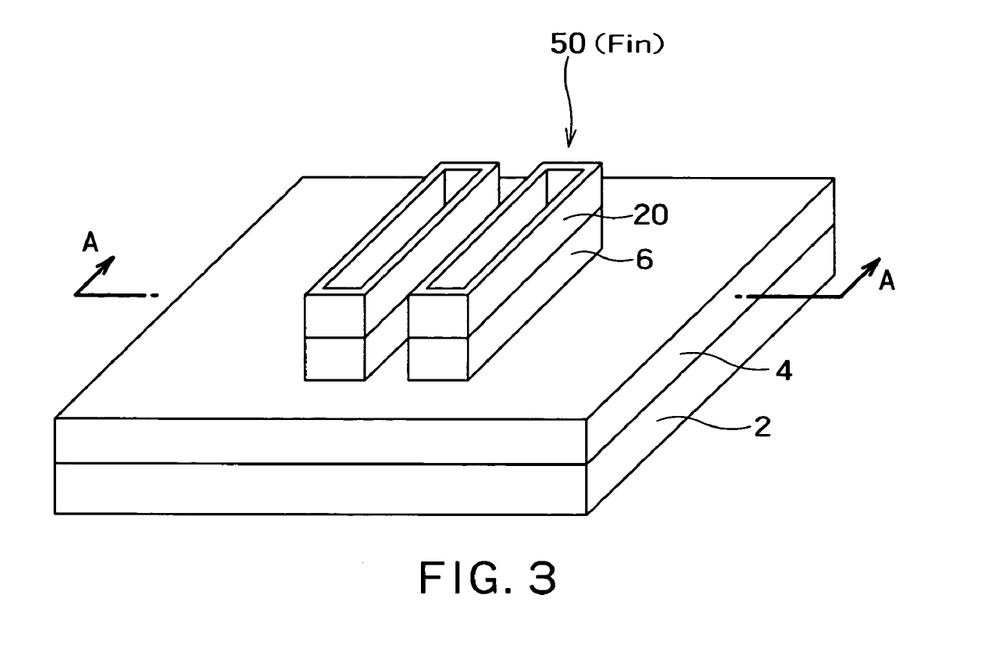

The silicon nitride film 20 is etched by RIE using the sidewall patterns 40 as masks. Furthermore, the SOI layer 6 is etched by using the etched silicon nitride film 20 as masks. In this manner, the structure shown in FIG. 3 can be obtained. As described above, an island-like or convex semiconductor portion is called a Fin. In this embodiment, for example, the patterned SOI layer 6 corresponds to a Fin. The silicon nitride film 20 is called a hard mask for processing a Fin. In this case, it is assumed that the SOI layer 6 or the silicon nitride film 20 and the SOI layer 6 are called a Fin 50. In FIG. 3, each two of four Fins 50 are connected to each other at the ends thereof. Pitches of these Fins 50 are the pitch $P_1$ almost equal to a pitch of the sidewall patterns 40. FIGS. 1 and 2 correspond to sectional views along an A-A line in FIG. 3.

Gate insulation films 60 are formed on the sidewalls of the Fins 50. The gate insulation films 60 may consist of a high dielectric constant material such as HfSiON or the like. Subsequently, a first polysilicon layer for a gate electrode is deposited. The thickness of the polysilicon layer is about 250 nm. At this time, since the polysilicon is deposited on the surfaces of the Fins 50 and the BOX layer 4, a large step is formed on the polysilicon surface. In order to planarize the step, the polysilicon is polished by CMP (Chemical Mechanical Polishing) until the silicon nitride film 20 is exposed. Furthermore, a second polysilicon layer for a gate electrode is deposited. The thickness of the polysilicon layer is about 50 nm. Both the first and second polysilicon layers are used as a gate electrode material.

Figure 4:
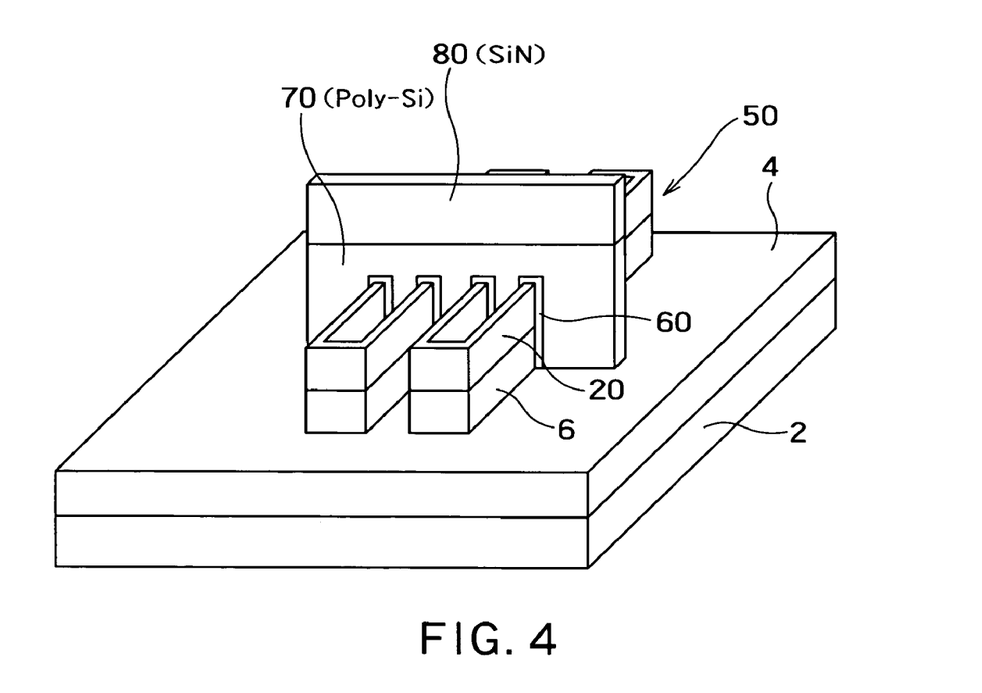

A silicon nitride film is deposited on the polysilicon as a hard mask. The thickness of the silicon nitride film is about 120 nm. Subsequently, by using an SWT process or the like, a gate mask pattern formed by, e.g., TEOS is formed on the silicon nitride film. The silicon nitride film is patterned by the gate mask pattern to remove the gate mask pattern by a hydrofluoric acid. In this manner, as shown in FIG. 4, a hard mask 80 consisting of a silicon nitride film is formed on the polysilicon. Furthermore, the polysilicon is patterned by RIE using the hard mask 80 as a mask. In this manner, as shown in FIG. 4, a gate electrode 70 is formed. The gate electrode 70 extends in the direction of arrangement of the plurality of Fins 50 and functions as a gate electrode common in these Fins 50. The gate electrode 70 is electrically insulated from the plurality of Fins 50 by the gate insulation films 60 and the silicon nitride films 20.

Figure 5:
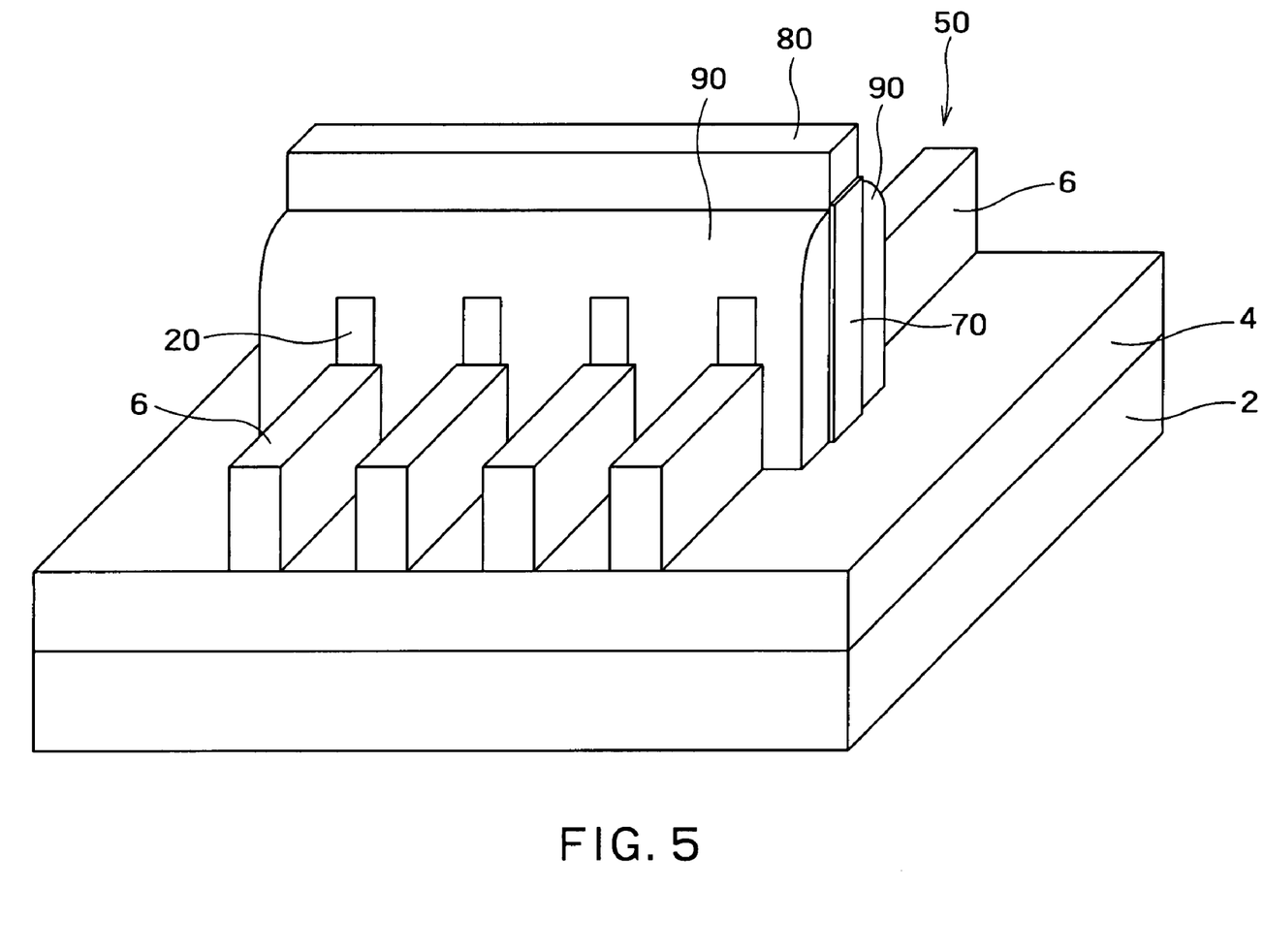

As a gate sidewall material, for example, a TEOS film is deposited. The thickness of the TEOS film is about 40 nm. Furthermore, the TEOS film is anisotropically etched by using RIE to form gate sidewall films 90 on the sidewalls of the gate electrode 70 as shown in FIG. 5. At this time, the silicon nitride films 20 in regions extending on both sides of the gate electrode 70 on the Fins 50 are removed by RIE together with the TEOS film. The hard mask 80 on the gate electrode 70 is left to have a thickness of about 30 nm. Regions extending on both the sides of the gate electrode 70 on the Fins 50 are regions in which source-drain region layers will be formed later.

Figure 6:
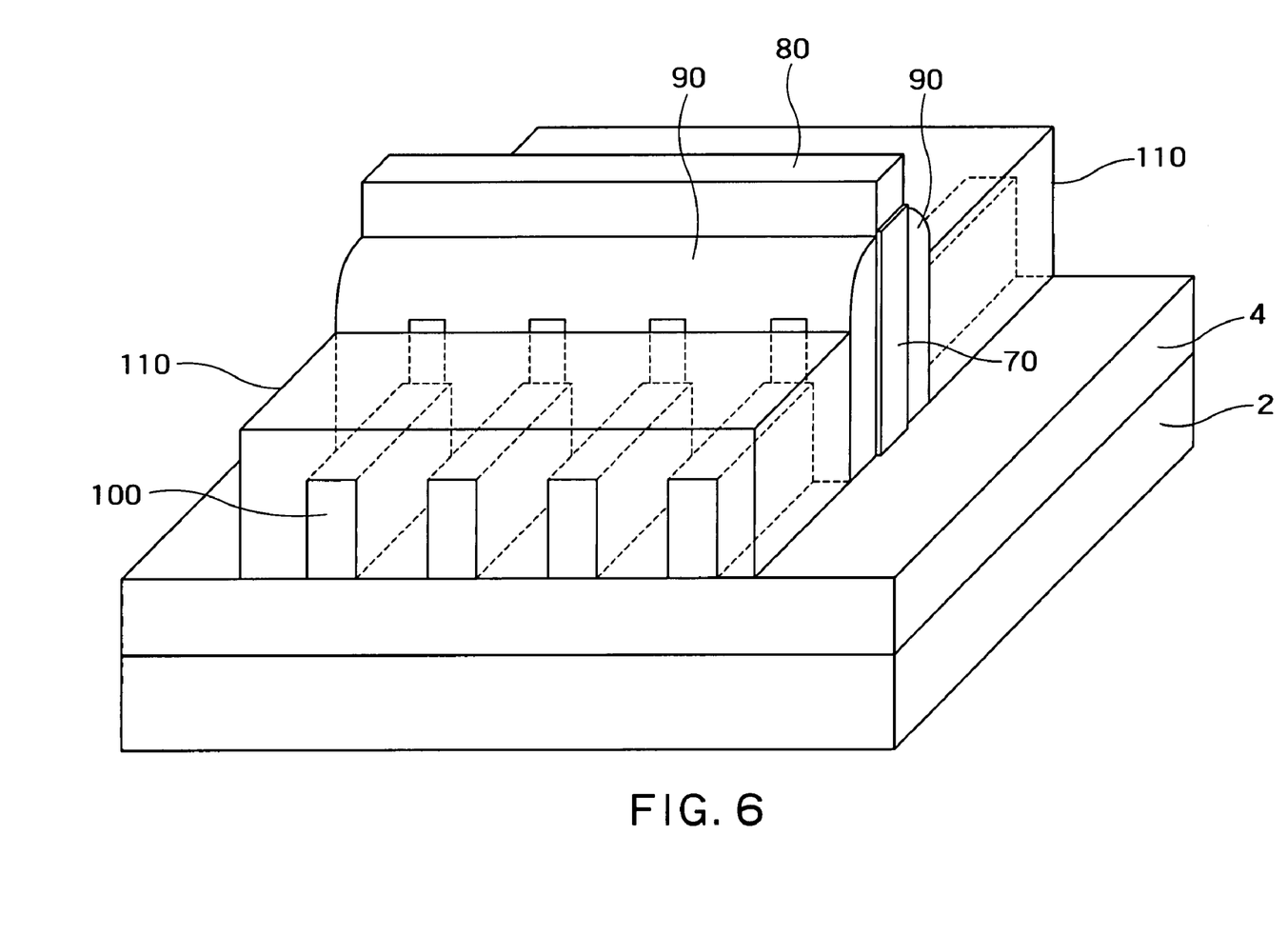

As shown in FIG. 6, a conductive material is deposited on upper and side surfaces of the Fins 50. More specifically, a silicon 110 is epitaxially grown from the upper and side surfaces of the Fins 50. The silicon 110 electrically connects the adjacent Fins 50 to each other.

Thereafter, an impurity is doped in the source-drain forming regions of the Fins 50 by an ion implantation method, a plasma doping method, or a solid-phase diffusion method. In this manner, source-drain layers (part or whole of silicon layers 100 and 110) are formed. The impurity concentration of the source-drain layers (part or whole of the silicon layers 100 and 110) is about $1 \times 10^{21}$ cm$^{-3}$.

Figure 7:
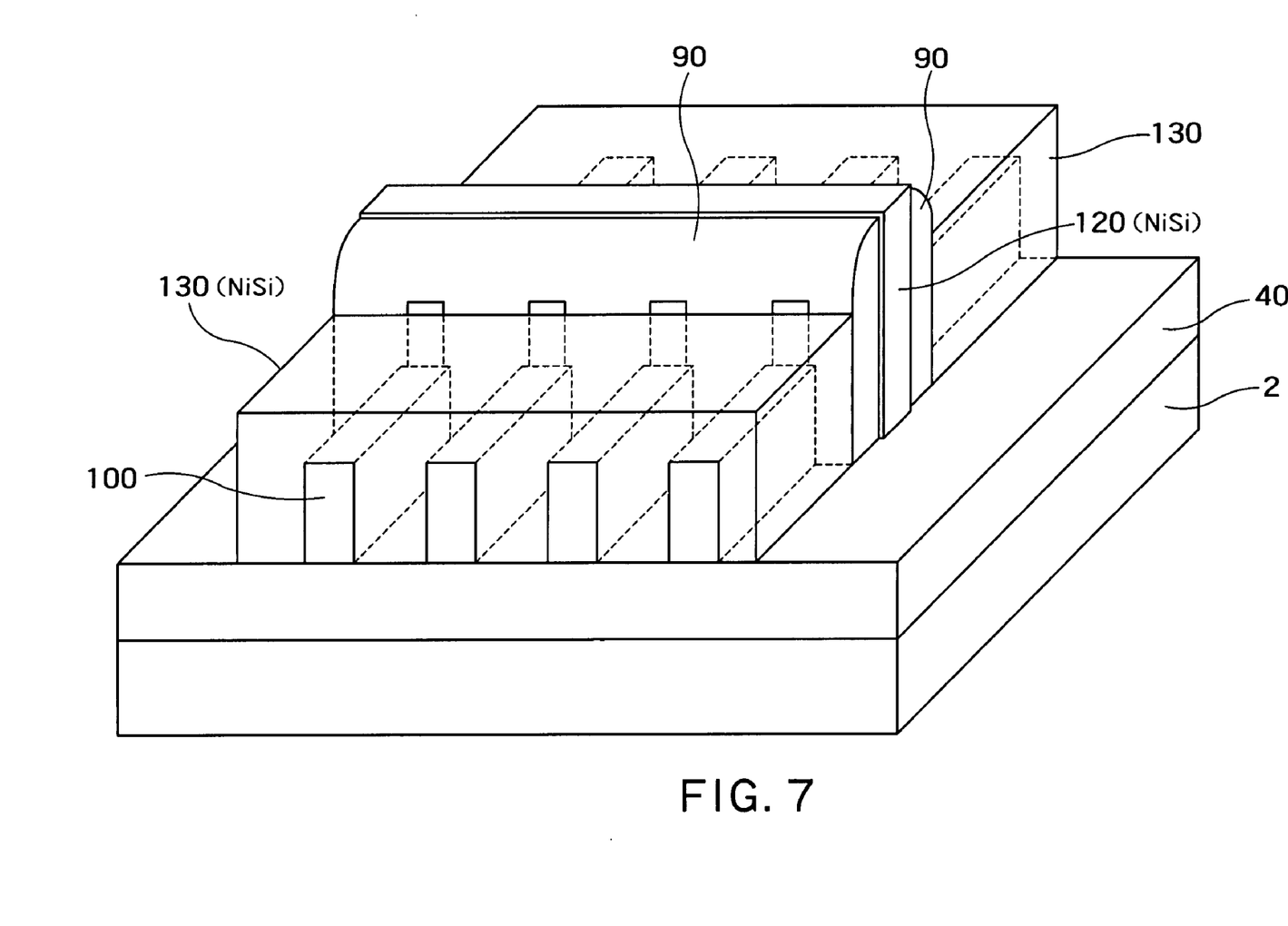

As shown in FIG. 7, the hard mask 80 on the gate electrode 70 is removed by wet etching. Furthermore, a metal is deposited on the gate electrode 70 and the epitaxial silicon layer 110. The metal is, e.g., nickel. Subsequently, at least the upper portions of the gate electrode 70 and the epitaxial polysilicon layer 110 are silicided by performing heat treatment. In this manner, the gate electrode 70 entirely or partially becomes a nickel silicide layer 120, and the epitaxial polysilicon layer 110 entirely or partially becomes a nickel silicide layer 130. The epitaxial polysilicon layer 110, the nickel silicide layer 130, and the source-drain diffusion layer (part of the polysilicon layers 100 and 110) function as source-drain electrodes. At this time, the gate electrode 70 may be fully silicified to be a metal gate. In this case, in order to adjust a threshold voltage of a Fin FET, an impurity is preferably doped in the gate electrode 70 consisting of polysilicon before silicidation. Thereafter, the Fin FET is completed by using conventional processes.

According to the first embodiment, after the Fins 50 is formed, the source-drain electrodes (100, 110, and 130) are formed. Therefore, when the silicon nitride film 20 serving as a mask material is etched, the etching can be performed by only using the hard mask (40) without using a photoresist mask. Therefore, etching selectivities between both the hard mask and the photoresist mask and the silicon nitride film need not be considered. The sidewalls of the etched silicon nitride film 20 are not tapered, and the sidewalls are good in verticality. As a result, the Fins 50 having a pitch smaller than the minimum pitch of lithography and each having a uniform width can be manufactured.

In the first embodiment, SWT is performed only once. Therefore, the pitch of the Fins 50 is the pitch $P_1$ half the minimum pitch $P_0$ which can be achieved by lithography. On the other hand, in the first embodiment, the silicon nitride film 20 is etched by using the hard mask (40) as a mask without using the photoresist mask. Therefore, verticality and selectivity of RIE can be assured. For this reason, SWT can be repeated many times. More specifically, the Fins can be formed at a pitch smaller than the pitch $P_1$. This is called multi-SWT conveniently.

(Multi-SWT Process)

Figure 8:
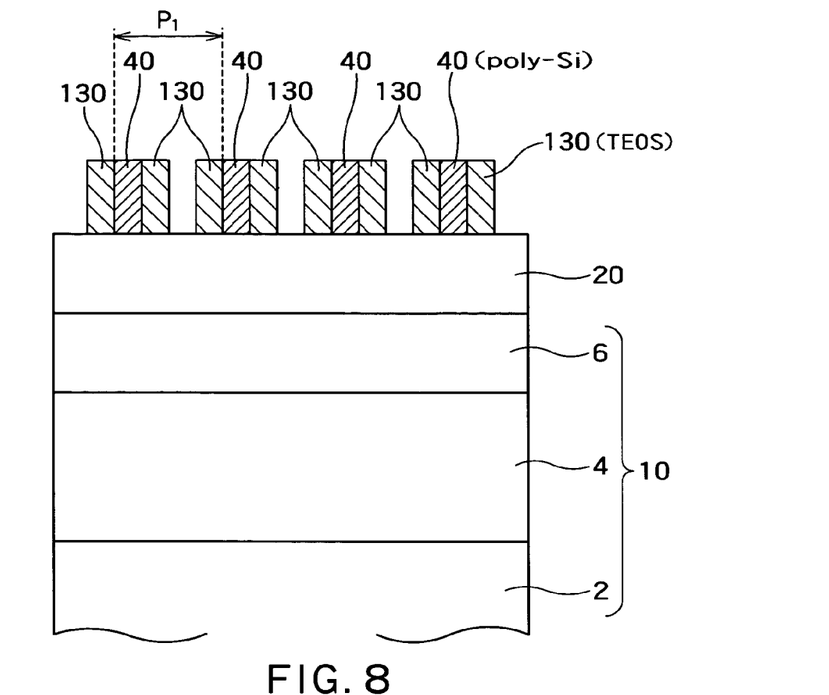
FIGS. 8 and 9 are sectional views showing a flow of the multi-SWT.
Figure 9:
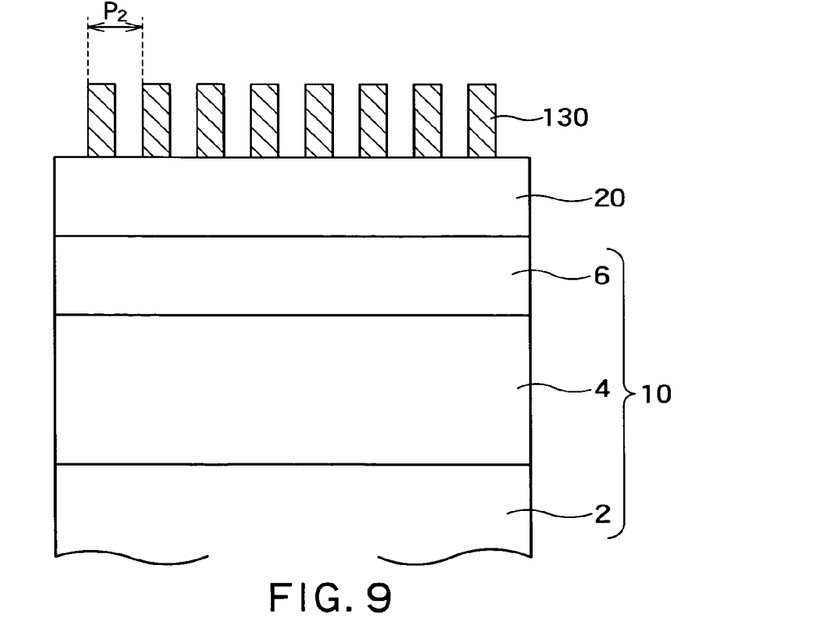

FIGS. 8 and 9 are sectional views showing a flow of the multi-SWT. The multi-SWT will be described below with reference to FIGS. 1, 2, 8 and 9. The same steps in FIGS. 1 and 2 in the first embodiment are performed. Reference numeral 40 in FIG. 2 denotes a first sidewall pattern consisting of a first sidewall material. The first sidewall material is, e.g., a polysilicon film. After the first sidewall pattern 40 is formed, a second sidewall material, which consists of a material different from that of the first sidewall pattern 40, is further deposited. The second sidewall material is, e.g., a TEOS film having a thickness of about 20 nm. The second sidewall material is anisotropically etched, as shown in FIG. 8, so that second sidewall patterns 130 are formed on both the side surfaces of the first sidewall pattern 40.

The first sidewall pattern 40 is selectively wet-etched while leaving the second sidewall patterns 130. In this manner, the second sidewall patterns 130 is arranged at a pitch $P_2$ which is a half of the pitch $P_1$. In other words, the pitch $P_2$ of the second sidewall patterns 130 is ¼ the minimum pitch $P_0$ which can be achieved by lithography.

When the silicon nitride film 20 is etched by RIE using the second sidewall patterns 130 as masks, a hard mask having the pitch $P_2$ is formed. Thereafter, the SOI layer 6 is etched by RIE using the etched silicon nitride film 20 as a hard mask. In this manner, Fins 50 (see FIG. 3) having the pitch $P_2$ are formed. The subsequent processes may be the same as those in the first embodiment.

In this manner, a Fin FET including the Fins 50 having a further small pitch can be formed. The pitch of the Fins 50 is decreased to make it possible to further miniaturize a Fin structure and to increase the concentration of the Fin structure. This means that a Fin FET having a large channel width can be formed in a small region. When the pitch of the Fins 50 is small, a distance between the Fins 50 decreases. For this reason, when a relative small amount of silicon is merely epitaxially grown, the Fins 50 can be connected to each other. In this manner, such a bridging effect that epitaxially grown silicon short-circuits a source-drain electrode and a gate electrode can be suppressed.

In the multi-SWT, the SWT step is repeated twice. However, the SWT step can be repeated three or more times. In this manner, the pitch of the Fins 50 can be further decreased. For example, when the SWT step is repeated three times, a third sidewall material, which consists of a material different from the second sidewall material, is deposited on the second sidewall patterns 130 having the pitch $P_2$. The third sidewall material is a polysilicon film having a thickness of, e.g., about 20 nm. The third sidewall material is anisotropically etched to form third sidewall patterns (not shown) on both the side surfaces of the second sidewall pattern 130.

The second sidewall patterns 130 are selectively etched while leaving the third sidewall patterns. In this manner, the third sidewall patterns have a half pitch of the pitch $P_2$, i.e., a pitch $P_3$ which is ⅛ the pitch $P_0$.

When the silicon nitride film 20 is etched by RIE using the third sidewall patterns as masks, hard masks having the pitch $P_3$. The SOI layer 6 is etched by RIE using the etched silicon nitride film 20 as a hard mask. In this manner, the Fins 50 having the pitch $P_3$ are formed.

When the SWT process is repeated as described above, a large number of Fins 50 can be arranged at a further fine pitch.

Second Embodiment

Figure 10:
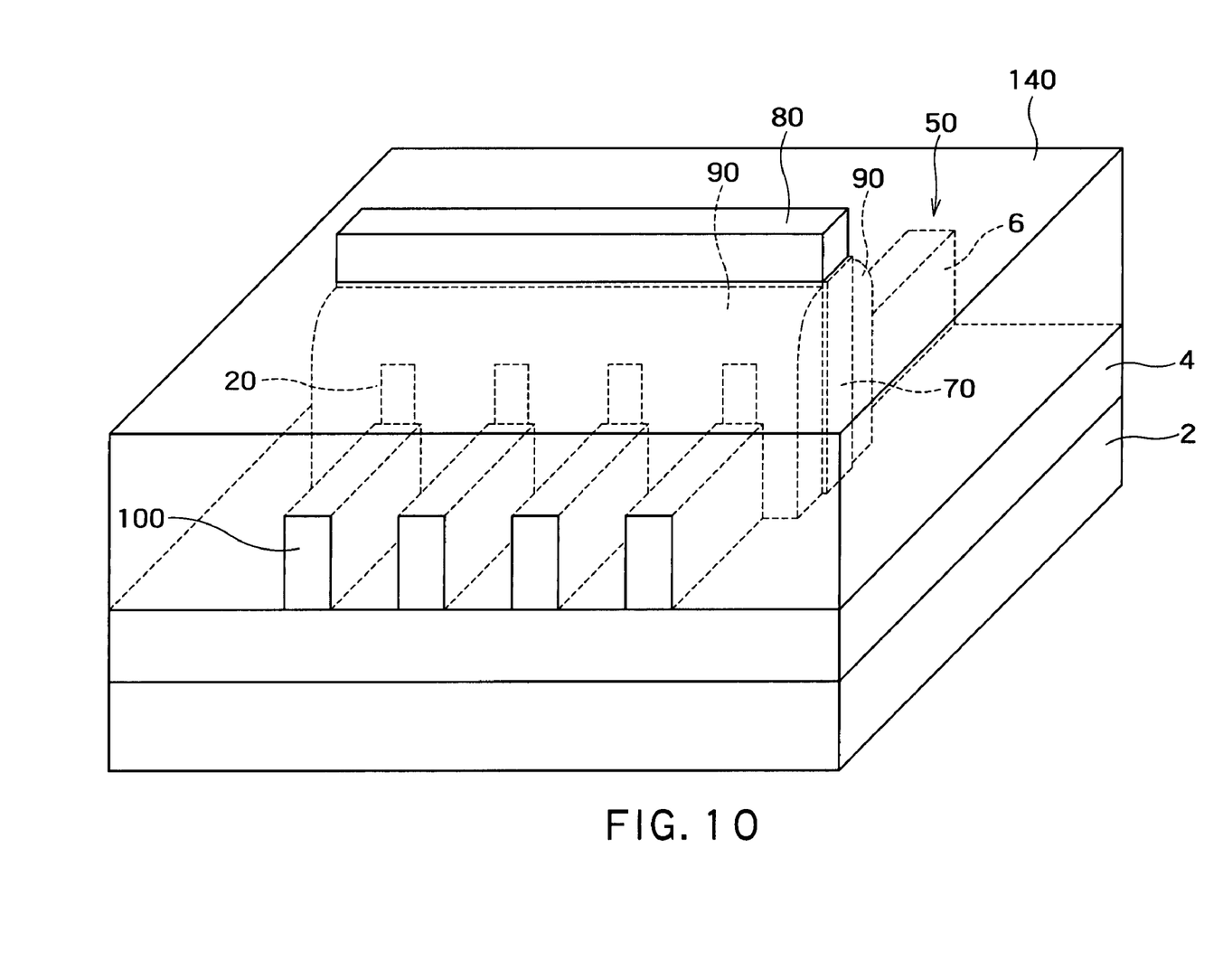
FIGS. 10 to 12 are perspective views showing a method of manufacturing a Fin FET according to the second embodiment of the present invention.
Figure 11:
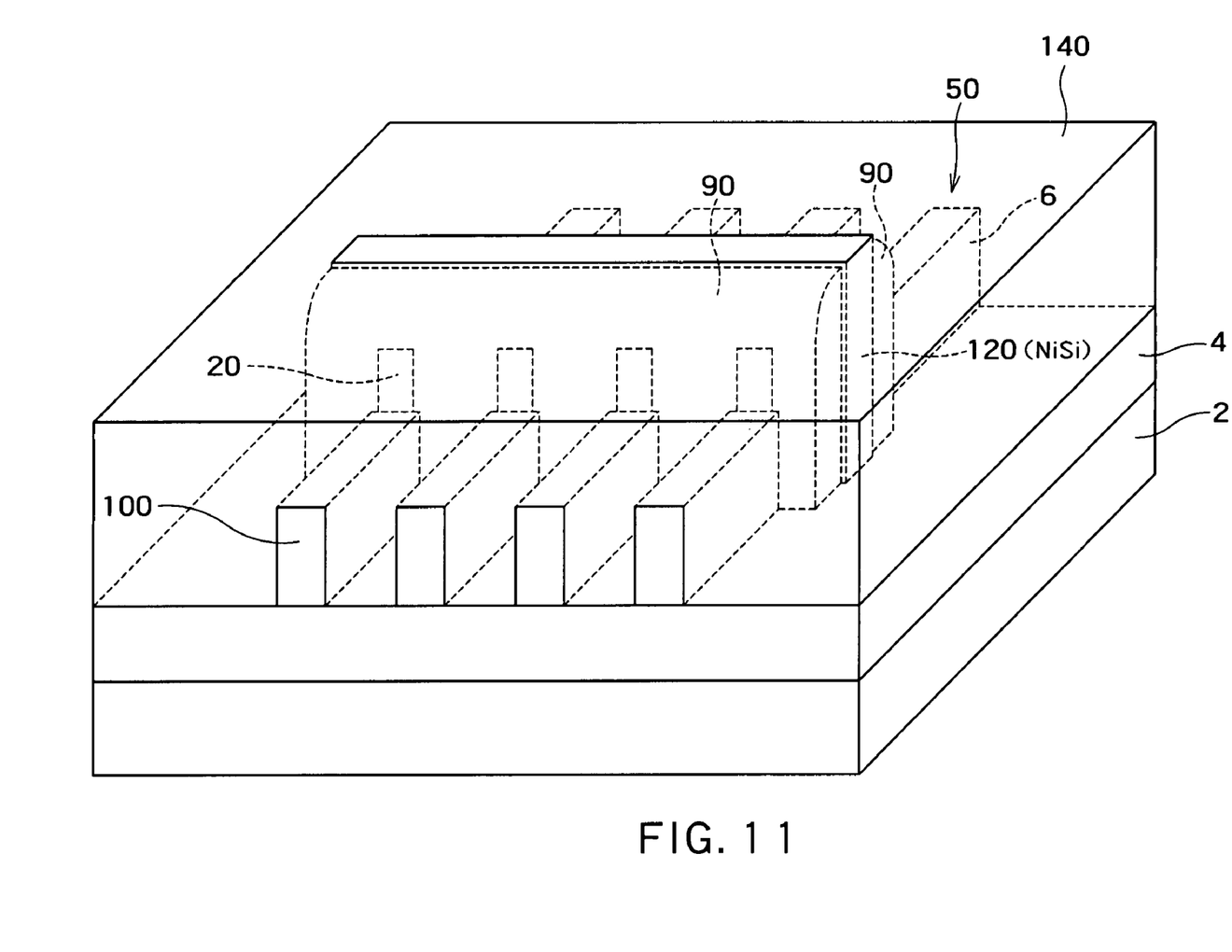
Figure 12:
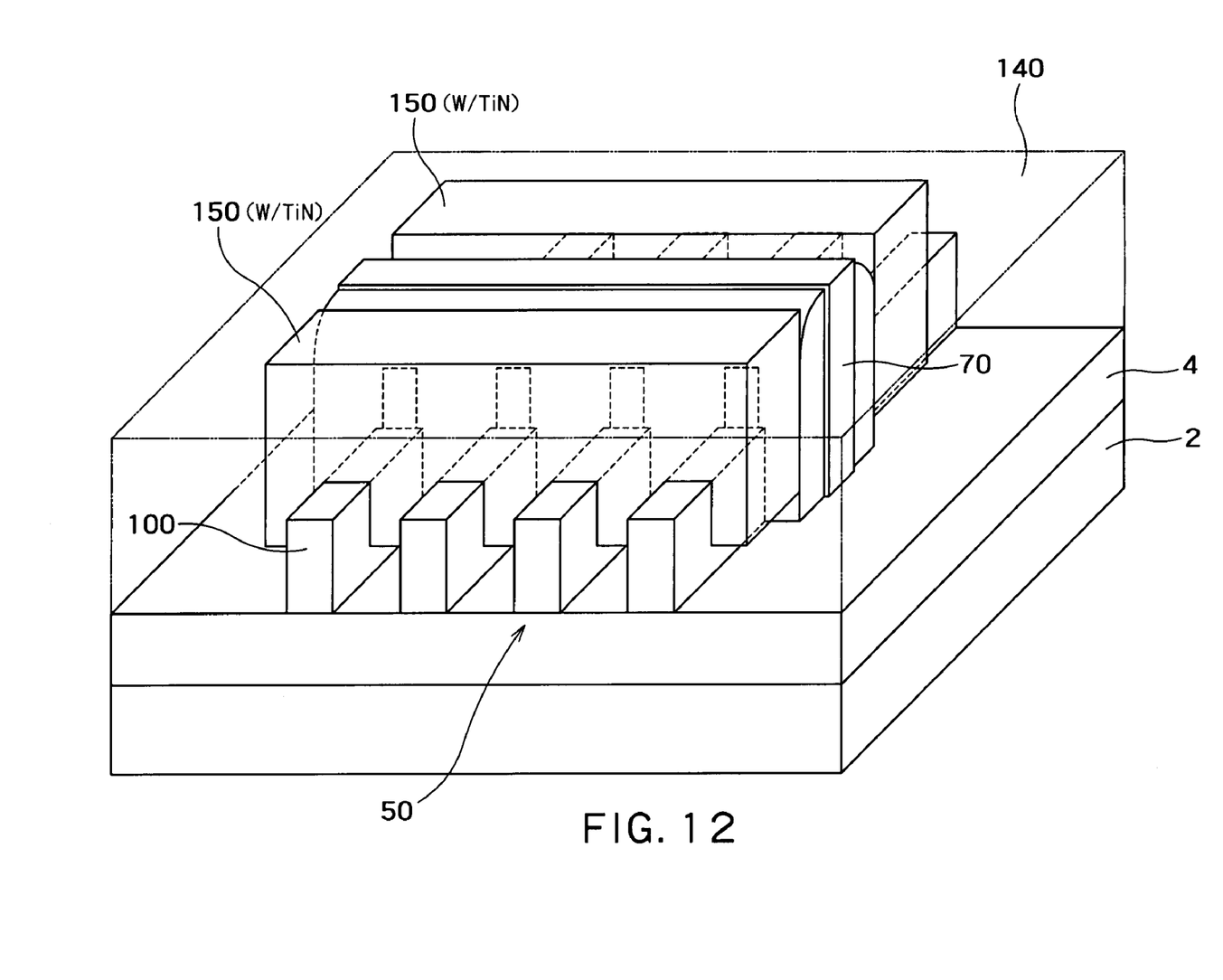

FIGS. 10 to 12 are perspective views showing a method of manufacturing a Fin FET according to the second embodiment of the present invention. The second embodiment is different from the first embodiment in the step of forming a source-drain region. Therefore, in the second embodiment, the Fin FET is formed by the same method as in the first embodiment until the step shown in FIG. 5.

As shown in FIG. 10, a silicon oxide film 140 is deposited by an HDP (High Density Plasma)-CVD method to cover the Fins 50. The thickness of the silicon oxide film 140 is about 400 nm. After the silicon oxide film 140 is planarized by CMP, the silicon oxide film 140 is etched back by hydrofluoric acid or the like until the hard mask 80 on the gate electrode 70 is exposed. Then, the hard mask 80 is wet-etched to expose the top surface of the gate electrode 70. A metal, e.g., nickel is deposited on the gate electrode 70. The nickel is subjected to heat treatment to fully silicide the gate electrode 70, so that a nickel suicide layer 120 is formed as shown in FIG. 11.

The silicon oxide film on the source-drain region is removed by lithography and RIE. In this manner, the upper and side surfaces of the Fins 50 are partially exposed. As shown in FIG. 12, for example, a metal such as tungsten (W) or titanium nitride (TiN) is buried in trenches as contact plugs 150. Adjacent Fins 50 are electrically connected to each other by the contact plug 150. Thereafter, a Fin FET is completed by using a conventional manufacturing method.

According to the second embodiment, the plurality of Fins 50 can be easily connected to each other by the contact plugs 150 consisting of a metal. Furthermore, the second embodiment can achieve the same effect as that obtained in the first embodiment. As a matter of course, the multi-SWT can be applied to the second embodiment.

A Fin FET manufactured according to the second embodiment, as shown in FIG. 12, includes a BOX layer 4 serving as an insulation layer, a plurality of Fins 50, a gate insulation film 60, gate electrodes 70 and 120, source-drain layers 100, and a contact plug 150 serving as conductive materials for connecting sources and drains.

The Fins 50 consist of a semiconductor material, and are arranged on the BOX layer 4 at a pitch $P_1$ or $P_2$ smaller than the minimum pitch which can be achieved by lithography. The gate insulation film 60 is arranged between a sidewall of the Fin 50 and the gate electrode 70. The gate electrode 70 extends in a direction of arrangement of the Fins 50, and is electrically insulated from the Fins 50. Furthermore, the gate electrode 70 is used to be in common in the plurality of Fins 50. The source-drain layers 100 are formed on both sides of the gate electrode 70 of the Fins 50. The contact plugs 150 for connecting the sources and the drains are in contact with an upper or side surfaces of the source-drain layers of the Fins.

The contact plugs 150 may be in entire contact with the side surfaces of the Fins 50. However, the plugs 150 need not be in entire contact with the side surfaces, the plugs 150 may be in contact with only upper half portions of the Fins 50.

According to the method of manufacturing a semiconductor device, the Fin FET described above can be manufactured.

Third Embodiment

Figure 13:
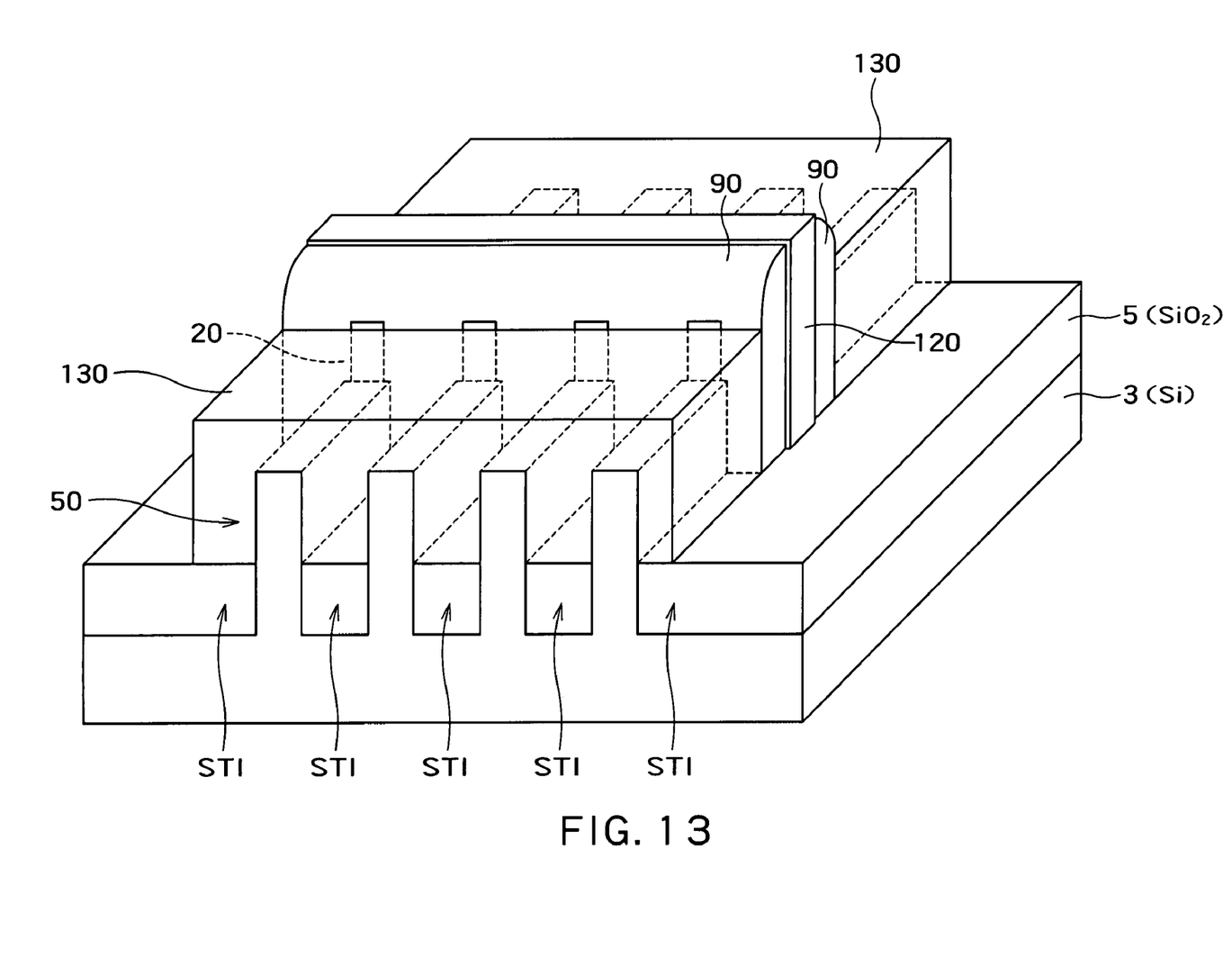
FIG. 13 is a perspective view of a Fin FET according to an embodiment of the present invention.

FIG. 13 is a perspective view of a Fin FET according to an embodiment of the present invention. An SOI substrate is used in the first and second embodiments. However, a bulk silicon substrate 3 is used in the third embodiment. Therefore, a silicon nitride film 20 for a hard mask is deposited on the bulk silicon substrate 3. SWT or multi-SWT is applied to the silicon nitride film 20 to form a hard mask having a pitch smaller than the minimum pitch $P_0$ which can be achieved by lithography. The dummy pattern 30 is etched by RIE using the hard mask. In this manner, Fins 50 having a pitch smaller than the pitch $P_0$ are formed. At this time, a trench is formed between the Fins 50. A silicon oxide film 5 is filled in a lower part of the trench. In this manner, STI (Shallow Trench Isolation) is formed. Since no silicon oxide film is deposited on the upper part of the trench, a structure in which the Fins 50 project on the silicon oxide film 5 as shown in FIG. 13.

Thereafter, a Fin FET is completed through the same steps as in the first or second embodiments. In FIG. 13, as in the first embodiment, epitaxially grown silicon is arranged in a source-drain region. In place of this, as in the second embodiment, a plug contact 150 consisting of a metal may be arranged in the source-drain region.

Although the bulk silicon substrate 3 is used in the third embodiment, the same effect as in the first or second embodiment can be obtained. Since the bulk silicon substrate 3 is used in the third embodiment, the Fin FET can be manufactured at a cost lower than that using an SOI substrate.

Fourth Embodiment

Figure 14A:
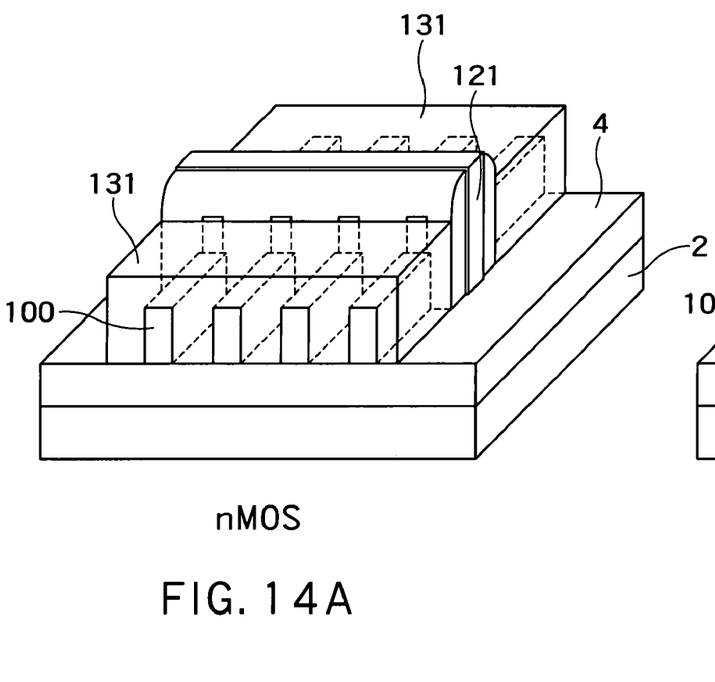
FIGS. 14A and 14B are perspective views of Fin FET according to the fourth embodiment of the present invention.
Figure 14B:
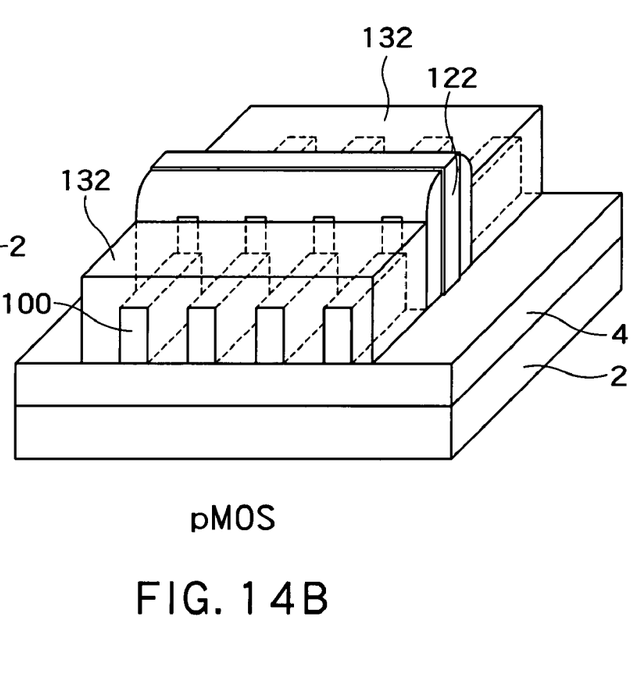

FIGS. 14A and 14B are perspective views of Fin FET according to the fourth embodiment of the present invention. In the fourth embodiment, different materials are used as gate electrodes of an nMOS and a pMOS. The other configuration of the fourth embodiment may be the same as that in the first or second embodiment.

In the fourth embodiment, a material of an nMOS gate electrode 121 is a material having a work function (work function of 4.6 eV or less) closer to a conduction band than to the center level of the bandgap of silicon. For example, the material of the gate electrode 121 may be any one of $YbSi_{2-x}$, $ErSi_{2-x}$, $TbSi_{2-x}$, and $DySi_{2-x}$.

A material of a pMOS gate electrode 122 is a material having a work function (work function of 4.6 eV or more) closer to a valence band than to the center level of the bandgap of silicon. For example, the material of the gate electrode 122 may be PtSi.

According to the fourth embodiment, the work function of the nMOS gate electrode 121 is close to the conduction band of silicon, and the work function of the PMOS gate electrode 122 is close to the valence band of silicon. For this reason, a low threshold voltage of about 0.15 V can be realized.

Furthermore, when an nMOS source-drain electrode 131 consists of the same material as that of the gate electrode 121, and when a pMOS source-drain electrode 132 consists of the same material as that of the gate electrode 122, a contact resistance on the interface between the silicon of the source-drain layer 100 and the silicide of the source-drain electrodes 131 and 132 decreases. Therefore, the Fin FET according to the embodiment can achieve a large drive current, and can be operated at a high speed.

Fifth Embodiment

Figure 15A:
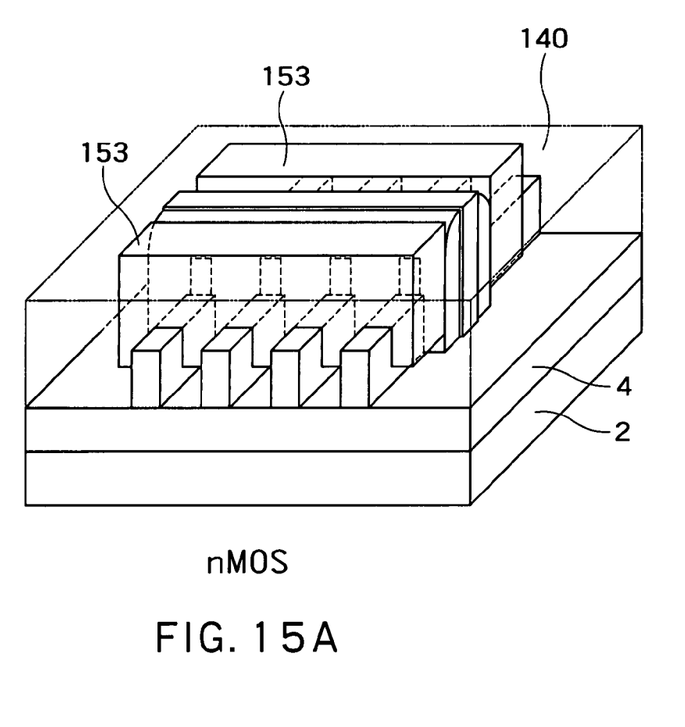
FIGS. 15A and 15B are perspective views of a Fin FET according to a fifth embodiment of the present invention.
Figure 15B:
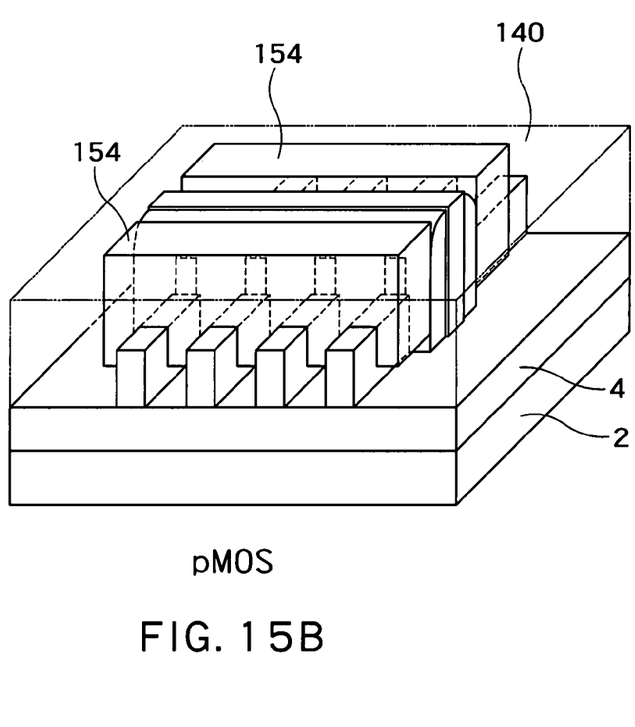

FIGS. 15A and 15B are perspective views of a Fin FET according to a fifth embodiment of the present invention. The fifth embodiment employs a metal gate as a gate electrode by using a damascene process. The other configuration of the fifth embodiment may be the same as that in the second embodiment. In a manufacturing method according to the fifth embodiment, the same manufacturing method as in the second embodiment is performed until the step in FIG. 10.

After the hard mask 80 shown in FIG. 10 is removed, polysilicon (70) in a gate electrode region and a silicon oxide film (60) in a gate insulation film region are removed by RIE or wet etching. At this time a trench is formed in the gate electrode region. As the gate insulation film, for example, a high-dielectric-constant material such as HfSiON is deposited, and then a metal is buried in the gate electrode region (trench) by using a damascene process.

Thereafter, as in the second embodiment, a contact plug is formed in the source-drain region.

As materials of an nMOS gate electrode and a contact plug 153, materials each having a work function (work function of 4.6 eV or less) closer to a conduction band than to the center level of the bandgap of silicon are preferably used. For example, RuTa, Ta, Hf—AlN, TaN, (Ar-ion-doped) Mo, Ti, Er, and the like can be employed as the materials of the nMOS gate electrode and the contact plug 153.

As materials of a pMOS gate electrode and a contact plug 154, materials each having a work function (work function of 4.6 eV or more) closer to a valence band than to the center level of the bandgap of silicon are preferably used. For example, Ru, Ta—AlN, Mo, NiGe, Pt, Ni, W, and the like can be employed as the materials of the pMOS gate electrode and the contact plug 154.

According to the fifth embodiment, since the metal gate electrode is used, a gate electrode is not depleted in the operation of the Fin FET. In the fifth embodiment, since the work functions of the nMOS gate electrode and the pMOS gate electrode are set same as in the fourth embodiment, a low threshold voltage can be realized.

Furthermore, in the fifth embodiment, the work functions of the nMOS and the pMOS are appropriately set. In this manner, a parasitic resistance is further reduced. As a result, the device can be miniaturized, and the device can be operated at a high speed. In addition, according to the fifth embodiment, the same effect as in the second embodiment can be obtained.

In the first to fifth embodiments, the process of electrically connecting the plurality of Fins 50 to each other and the process of forming a source-drain diffusion layer (part or whole of the polysilicon layers 100 and 110) may be performed in reverse order.

What is claimed is:

1. A semiconductor device comprising:
   an insulation layer;
   a plurality of Fins arranged on the insulating film at a pitch smaller than a minimum pitch which includes a line and space pattern;
   gate insulation films formed on sidewalls of the Fins;
   a gate electrode which extends in a direction of arrangement of the Fins and which is electrically insulated from the plurality of Fins, the gate electrode being common in the plurality of Fins;
   source-drain layers formed in portions of the Fins, the portions of the Fins being arranged on both sides of the gate electrode; and
   a metal or a metal silicide which is in contact with upper surfaces or side surfaces of the source-drain layers of the plurality of Fins to connect the Fins to each other.

2. The semiconductor device according to claim 1, wherein pitches between Fins being adjacent to each other is any one of $\frac{1}{2}$, $\frac{1}{4}$, $\frac{1}{8}$ . . . $\frac{1}{2^n}$ (n is a natural number) of a minimum pitch which includes a line and space pattern.

3. The semiconductor device according to claim 1, wherein a material of the gate electrode of an nMOS is a material having a work function closer to a conduction band than to the center level of the bandgap of silicon, and a material of the gate electrode of a pMOS is a material having a work function closer to a valence band than to the center level of the bandgap of silicon.

4. The semiconductor device according to claim 1, wherein a material of the gate electrode of an nMOS is any one of $YbSi_{2-x}$, $ErSi_{2-x}$, $TbSi_{2-x}$, $DySi_{2-x}$ RuTa, Ta, Hf—AlN, TaN, Ti, (Ar-ion-doped) Mo, and Er, and a material of the gate electrode of a pMOS is any one of PtSi, Ru, Ta—AlN, Mo, NiGe, Pt, Ni, W, and TiN.

5. The semiconductor device according to claim 1, wherein a material of the source-drain electrodes of an nMOS is a material having a work function closer to a conduction band than to the center level of the bandgap of silicon, and a material of the source-drain electrodes of a pMOS is a material having a work function closer to a valence band than to the center level of the bandgap of silicon.

6. The semiconductor device according to claim 1, wherein
a material of the source-drain electrode of an nMOS is any one of $YbSi_{2-x}$, $ErSi_{2-x}$, $TbSi_{2-x}$, $DySi_{2-x}$, RuTa, Ta, Hf—AlN, TaN, Ti, (Ar-ion-doped) Mo, and Er, and
a material of the source-drain electrode of a pMOS is any one of PtSi, Ru, Ta—AlN, Mo, NiGe, Pt, Ni, W, and TiN.

7. The semiconductor device according to claim 2, wherein
a material of the gate electrode of the nMOS is a material having a work function closer to a conduction band than to the center level of the bandgap of silicon, and
a material of the gate electrode of a pMOS is a material having a work function closer to a valence band than to the center level of the bandgap of silicon.

8. The semiconductor device according to claim 2, wherein
a material of the gate electrode of an nMOS is any one of $YbSi_{2-x}$, $ErSi_{2-x}$, $TbSi_{2-x}$, $DySi_{2-x}$, RuTa, Ta, Hf—AlN, TaN, Ti, (Ar-ion-doped) Mo, and Er and
a material of the gate electrode of a pMOS is any one of PtSi, Ru, Ta—AlN, Mo, NiGe, Pt, Ni, W, and TiN.

9. The semiconductor device according to claim 2, wherein
a material of the source-drain electrodes of an nMOS is a material having a work function closer to a conduction band than to the center level of the bandgap of silicon, and
a material of the source-drain electrodes of a pMOS is a material having a work function closer to a valence band than to the center level of the bandgap of silicon.

10. The semiconductor device according to claim 2, wherein
a material of the source-drain electrode of an nMOS is any one of $YbSi_{2-x}$, $ErSi_{2-x}$, $TbSi_{2-x}$, $DySi_{2-x}$, RuTa, Ta, Hf—AlN, TaN, Ti, (Ar-ion-doped) Mo, and Er, and
a material of the source-drain electrode of a pMOS is any one of PtSi, Ru, Ta—AlN, Mo, NiGe, Pt, Ni, W, and TiN.

* * * * *

UNITED STATES PATENT AND TRADEMARK OFFICE
CERTIFICATE OF CORRECTION

PATENT NO. : 7,608,890 B2  
APPLICATION NO. : 11/451318  
DATED : October 27, 2009  
INVENTOR(S) : Yagishita It is certified that error appears in the above-identified patent and that said Letters Patent is hereby corrected as shown below:

Title page, item (57), line 10, change "electrodes;" to --electrode;--.

*Claim 4, column 8, line 56, change "$DySi_{2-x}RuTa$," to --$DySi_{2-x}$, RuTa,--.

*Claim 4, column 8, line 56, change "Hf—AlN," to --Hf-AlN,--.

*Claim 4, column 8, line 59, change "Ta—AlN," to --Ta-AlN,--.

*Claim 6, column 9, line 4, change "Hf—AlN," to --Hf-AlN,--.

*Claim 6, column 9, line 6, change "Ta—AlN," to --Ta-AlN,--.

*Claim 8, column 9, line 17, change "Hf—AlN," to --Hf-AlN,--.

*Claim 8, column 9, line 18, change "Er and" to --Er, and--.

*Claim 8, column 10, line 2, change "Ta—AlN," to --Ta-AlN,--.

*Claim 10, column 10, line 15, change "Hf—AlN," to --Hf-AlN,--.

*Claim 10, column 10, line 17, change "Ta—AlN," to --Ta-AlN,--.

Signed and Sealed this

Ninth Day of February, 2010

David J. Kappos  
*Director of the United States Patent and Trademark Office*